US009578775B2

(12) United States Patent
Huang et al.

(10) Patent No.: US 9,578,775 B2
(45) Date of Patent: Feb. 21, 2017

(54) LGA SOCKET TERMINAL DAMAGE PREVENTION

(71) Applicant: GLOBALFOUNDRIES Inc., Grand Cayman (KY)

(72) Inventors: Sen Xiong Huang, Shenzhe (CN); Yun Liang, Shenzhen (CN); Yuan Lin, Shenzhen (CN)

(73) Assignee: GLOBALFOUNDRIES INC., Grand Cayman (KY)

( * ) Notice: Subject to any disclaimer, the term of this patent is extended or adjusted under 35 U.S.C. 154(b) by 103 days.

(21) Appl. No.: 14/528,316

(22) Filed: Oct. 30, 2014

(65) Prior Publication Data

US 2015/0118894 A1   Apr. 30, 2015

(30) Foreign Application Priority Data

Oct. 30, 2013   (CN) .......................... 2013 1 0524739

(51) Int. Cl.
  *H01R 13/625*   (2006.01)
  *H05K 7/10*   (2006.01)

(52) U.S. Cl.
  CPC .................................. *H05K 7/1061* (2013.01)

(58) Field of Classification Search
  CPC ..... H01R 13/639; H01R 13/62; H01R 13/518; H01R 13/20; H01R 13/236; H01R 13/4226; H01R 13/6272–13/6277; H01R 23/6893; H01R 23/7073; H01R 23/7084
  USPC ................. 439/767, 29, 266, 296, 331, 345, 66–91,439/660, 525, 342, 152, 160, 377, 526, 372,439/374, 483, 476.1
  See application file for complete search history.

(56) References Cited

U.S. PATENT DOCUMENTS

| 6,969,266 | B2 | 11/2005 | Chu et al. | |
| 6,971,902 | B2* | 12/2005 | Taylor | H01R 13/2442 439/331 |
| 7,083,456 | B2* | 8/2006 | Trout | H01R 13/2442 439/326 |

(Continued)

FOREIGN PATENT DOCUMENTS

WO   2004095239 A2   11/2004

OTHER PUBLICATIONS

"Land grid array socket design for minimizing pin damage during device insertion and removal", ip.com, IBM, IPCOM000169628D, Apr. 24, 2008, 8 pp.

(Continued)

*Primary Examiner* — Amy Cohen Johnson
*Assistant Examiner* — Milagros Jeancharles
(74) *Attorney, Agent, or Firm* — Yuanmin Cai; Andrew M. Calderon; Roberts Mlotkowski Safran Cole & Calderon, P.C.

(57) ABSTRACT

A land grid array (LGA) socket apparatus includes an LGA socket, with two guide rails provided respectively on the inner sides of two opposite side walls of the socket. The height of the top surface of each guide rail from the socket's bottom is greater than the height of socket terminals from the socket's bottom. The length of each guide rail is smaller than the length of the sidewall's inner side. The guide rails support at least two protrusions provided at corners at opposite sides of an integrated circuit chip assembly when the assembly is slid into the socket from a side. The guide rails, when the assembly is slid to the end of the guide rail, enable the at least two protrusions to fall into the gaps between the ends of the guide rail and the respective socket end walls to install the assembly in the socket.

20 Claims, 7 Drawing Sheets

(56) References Cited

U.S. PATENT DOCUMENTS

| | | | |
|---|---|---|---|
| 7,179,093 B2* | 2/2007 | Holmberg | H05K 7/1061 |
| | | | 439/331 |
| 7,507,102 B1 | 3/2009 | Bandholz et al. | |
| 8,096,812 B2* | 1/2012 | Perino | H05K 7/1431 |
| | | | 439/331 |
| 2007/0026717 A1* | 2/2007 | Toda | H05K 7/1053 |
| | | | 439/266 |
| 2012/0166113 A1 | 6/2012 | Pettersen et al. | |

OTHER PUBLICATIONS

"CPU socket pin damage sensibility evaluation solution", ip.com, IPCOM000227688D, May 13, 2013, 7 pp.

"Protecting microelectronic packages from contamination and damage", ip.com, IPCOM000135696D, Apr. 21, 2006, 4 pp.

\* cited by examiner

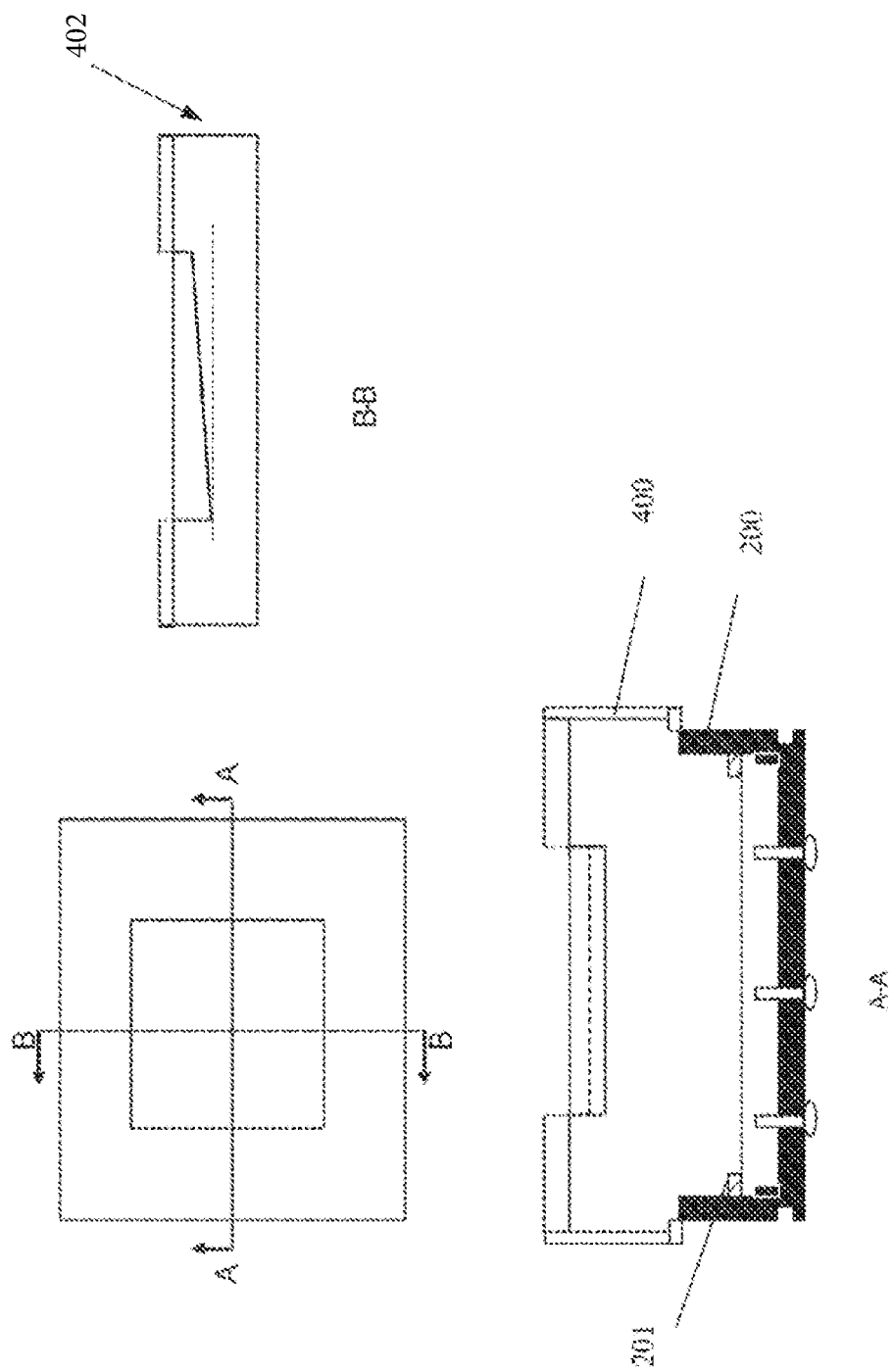

LGA SOCKET TERMINAL DAMAGE PREVENTION

This application claims priority to China patent application number 201310524739.8, filed Oct. 30, 2013.

BACKGROUND

Land grid array (LGA) sockets are used to provide electrical and mechanical connections between processors and printed circuit boards (PCBs) in PCs or servers. An LGA socket has an array of tiny copper spring pins, or terminals, which are electrically connected to a PCB, and the bottom surface of a processor has a corresponding LGA. When the processor is installed on the LGA socket, the land grid array is pressed against the array of the spring pins to form a reliable electrical connection.

SUMMARY

An example land grid array (LGA) socket apparatus for preventing LGA socket terminal damage includes an LGA socket with two guide rails provided respectively on inner sides of two opposite side walls of the LGA socket. A height of a top surface of each guide rail from a bottom of the LGA socket is greater than a height of LGA socket terminals from a bottom of the LGA socket, and a length of each guide rail is smaller than a length of an inner side of the sidewall. The guide rails are configured to support at least two protrusions provided respectively at corners at opposite sides of an integrated circuit chip assembly when the integrated circuit chip assembly is slid into the LGA socket from a side. The guide rails are configured to, when the integrated circuit chip assembly is slid to an end of the guide rail, enable the at least two protrusions to fall into the gaps between the end and another end of the guide rails and respective LGA socket end walls, so that the integrated circuit chip assembly is installed in the LGA socket.

An example integrated circuit chip assembly for preventing LGA socket terminal damage includes at least two protrusions provided respectively at corners at opposite sides of the integrated circuit chip assembly. The integrated circuit chip assembly is configured to place the at least two protrusions on two guide rails provided respectively on inner sides of two opposite side walls of an LGA socket. The two guide rails are to be slid into the LGA socket from a side. When being slid to ends of the guide rails, the at least two protrusions fall into gaps between ends of the guide rails and respective LGA socket end walls, so that the integrated circuit chip assembly is installed in the LGA socket.

An example method for preventing LGA socket terminal damage includes placing at least two protrusions provided respectively at corners at opposite sides of an integrated circuit chip assembly on two guide rails provided respectively on inner sides of two opposite side walls to be slid into an LGA socket from a side. When being slid to ends of the guide rails, the at least two protrusions fall into gaps between ends of the guide rails and respective LGA socket end walls, so that the integrated circuit chip assembly is installed in the LGA socket. A height of an upper surface of the guide rails from a bottom of the LGA socket is greater than a height of LGA socket terminals from a bottom of the LGA socket, and a length of the guide rails is smaller than a length of inner side of the sidewalls.

BRIEF DESCRIPTIONS OF THE DRAWINGS

The above and other objectives, features and advantages of the present invention will be more apparent from the description of exemplary embodiments of the present invention when read in conjunction with the accompanying drawings, and in the exemplary embodiments of the present invention, the same reference signs usually denote the same parts.

FIG. 4 is a diagram of a top view of an example pick and place (PnP), and top views at position A-A and position B-B.

DETAILED DESCRIPTION

Embodiments of the present invention are described by referring to the accompanying drawings. It is noted that numerous features are presented in the accompanying drawings and in the following description, which are merely illustrative and exemplary, and not restrictive of the present invention. In some embodiments of the present invention, some of the features may not be included, or other features not shown or described may be included.

Figure 1:
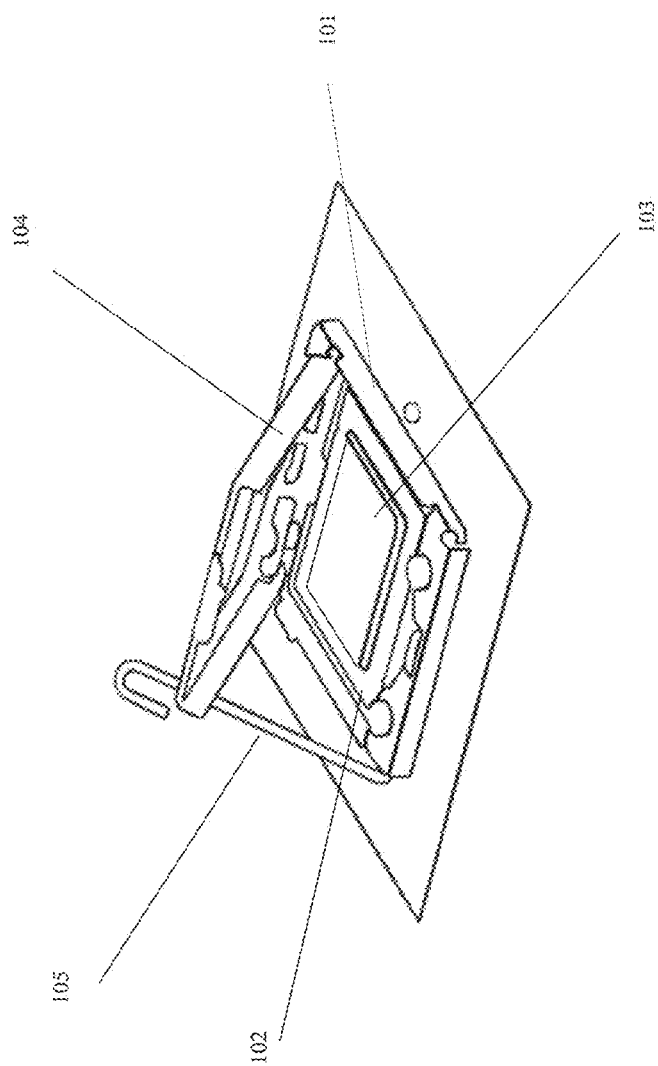
FIG. 1 is a diagram of a schematic view of an existing typical land grid array (LGA) socket apparatus.

FIG. 1 is a schematic diagram of an existing typical land grid array (LGA) socket apparatus. As shown, the LGA socket apparatus comprises a securing frame 101 fixed on a PCB, a LGA socket 102 within the securing frame 101, a processor 103 installed within the LGA socket 102, a hold-down plate 104 pivotally connected to one end of the securing frame 101, and a lever 105 pivotally connected to the other end of the securing frame. After the microprocessor package 103 is installed within the LGA socket 102, the hold-down plate 104 may be rotated to be pressed against the processor 103. The lever 105 may then be rotated to buckle the hold-down plate 104 on the securing frame 101, so that the processor 103 is securely pressed on the LGA socket 102, thus forming a stable electrical connection between the land grid array on the bottom surface of processor 103 and the spring pins in the LGA socket 102.

In addition, in existing approaches, during the process of manufacturing the LGA socket, usually a PnP (pick and place) cap is installed on the LGA socket. When the LGA socket is to be installed on the main board in the main board manufacturing plant, the PnP cap is sucked by a sucker machine, so that the entire socket will be sucked from the package box and placed at the soldering position on the main board. When the main board soldering process is over, the operator removes the PnP cap and installs a dust cover (which is usually on the hold-down plate).

A shortcoming of such an existing LGA socket apparatus is that when the processor is installed onto the LGA socket or removed from the LGA socket, improper operation may easily occur, which may damage the copper spring pins. In addition, the copper spring pins may also be damaged easily when removing the PnP cap manually. Existing approaches to reduce the risk of socket pin damage are disadvantageous however.

For example, in one such approach, a layer of guiding plate is added onto the central processing unit (CPU), or microprocessor. The CPU with the guiding plate is preinstalled into a hold-down plate with a unique slot design, and then the hold-down plate is used to press the CPU into the socket to keep the circuit connected. A disadvantage of this approach is high cost, up to about 50%. In addition, this approach cannot remove the PnP cap automatically, which still has to be removed manually, where there is still pin damage risk. Furthermore, since thermal grease is usually put on the processor after the processor is installed on the socket, the hold-down plate will be contaminated by the thermal grease after the processor is removed from the socket.

Techniques disclosed herein prevent LGA socket terminal damage in ways that overcome these shortcomings. These techniques are simpler and implemented at low cost than existing approaches. The techniques disclosed herein further effectively reduce the risk of damaging the socket pins when installing and removing the processor.

Figures 2A, 2B:
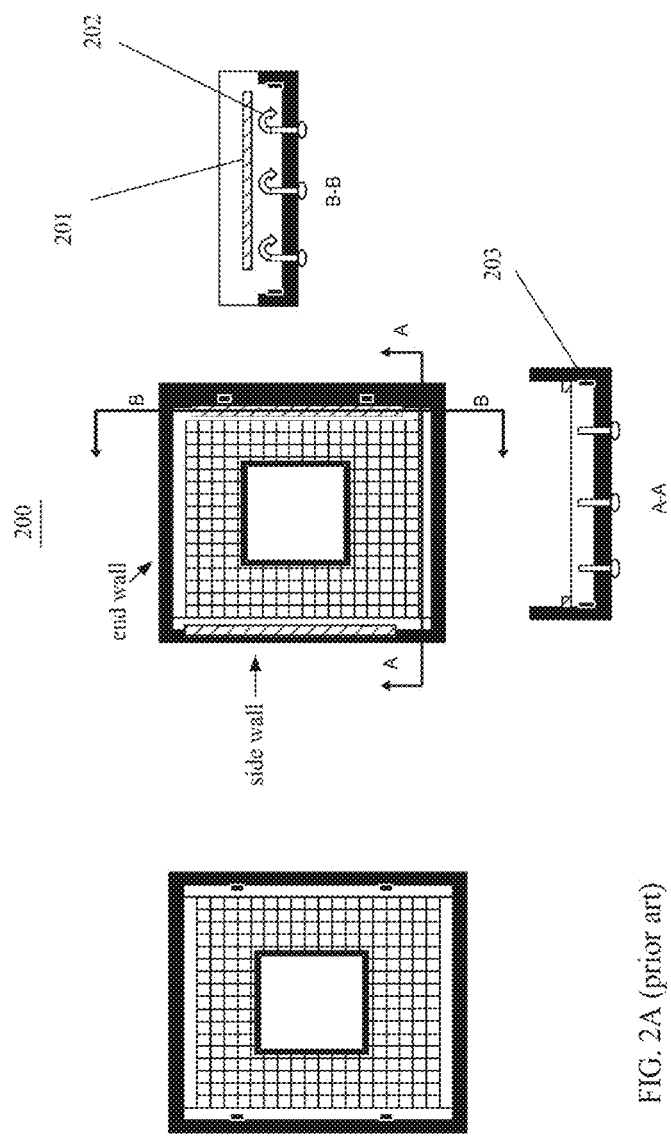
FIG. 2A is a diagram of a top view of an existing LGA socket.
FIG. 2B is a diagram of a top view of an LGA socket and cross-sectional views at position A-A and position B-B.

FIG. 2A shows a top view of an existing LGA socket, and FIG. 2B shows a top view of an example LGA socket according to the techniques disclosed herein and the cross-sectional views at position A-A and position B-B. As shown in FIGS. 2A and 2B, compared with the existing LGA socket, the LGA socket 200 according to the techniques disclosed herein has a guide rail 201 provided respectively on the inner side of either of its two opposite side walls. The height of the top surface of the guide rail 201 from the bottom surface of the LGA socket is greater than the height of the LGA socket terminals 202 from the bottom surface of the LGA socket, and the length of the guide rail 201 is smaller than the length of the inner side of the sidewall.

As shown in FIG. 2B, the lengths of the two guide rails 201 are equal and disposed at the corresponding positions on the inner sides of the two sidewalls. The length of the gap between one end of each guide rail 201 and one end wall of the LGA socket is different from the length of the gap between the other end of the guide rail 201 and the other end wall of the LGA socket. In one implementation, there may only be a gap between one end of the guide rail and on end wall of the LGA socket, and there may be no gap between the other end of the guide rail 201 and the other end wall—i.e., the latter gap is zero. By making the gaps between the two ends of the guide rail 201 and the end walls of the LGA socket different, and correspondingly by making the protrusions 301 at the two ends of the integrated circuit assembly 300 to match the gaps respectively as described below, it may be ensured that the integrated circuit chip assembly 300 is installed in the right orientation. This prevents the damage caused to the spring pins in the LGA socket 200 when the orientation of the installation is incorrect. In other implementations, the two guide rails may also have different lengths, or be at positions not corresponding with each other on the inner sides of the two sidewalls.

In one implementation, the only difference between the LGA socket 200 and the existing LGA socket lies in the guide rails 201. In other implementations, the LGA socket 200 and the existing socket may have other differences. One such additional difference is a removal device described below.

In the cross-sectional view of FIG. 2B, a stop plate 203 is also shown, which is a stop plate in the existing LGA socket (not shown in FIG. 2A). A stop plate is for supporting the processor package after installing the processor package in the LGA socket, so as to avoid the excessive compression between the land at the bottom surface of the processor and the tiny spring pins in the LGA socket. The LGA socket 200 may further includes other structures and devices not shown, such as those for positioning the processor package in the LGA socket, and so on.

Figure 3A:
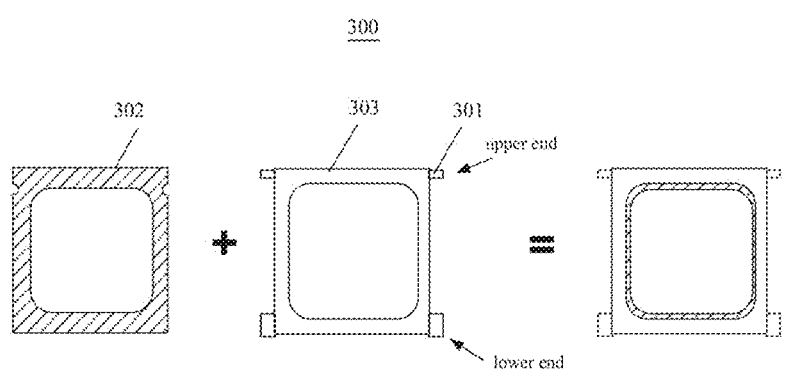
FIG. 3A is a diagram of an example integrated circuit chip assembly.
Figure 3B:
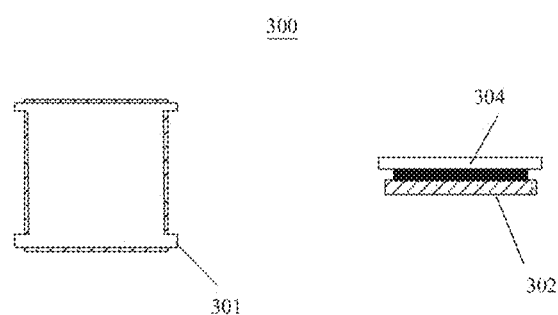
FIG. 3B is a diagram of another example integrated circuit chip assembly.

FIG. 3A shows an example integrated circuit chip assembly, and FIG. 3B shows another example integrated circuit chip assembly. As shown in FIGS. 3A and 3B, at the four corners of the integrated circuit chip assembly 300 are provided four protrusions 301 respectively, and the four protrusions protrude outward from the two sides of the integrated circuit chip assembly 300 respectively. The positions and sizes of the four protrusions 301 enable them to be placed on the two guide rails 201 of the LGA socket 200 respectively. As such, the integrated circuit chip assembly 300 can be slid from the side of the LGA socket 200 into the LGA socket 200. When the assembly 300 is slid to the end of the guide rails 201, the four protrusions 301 fall into the gaps between the two ends of the guide rails 201 and the respective end walls of the LGA socket respectively. In this way, the integrated circuit chip assembly 300 is installed in the LGA socket 200.

In addition, as shown in FIGS. 3A and 3B, as to the four protrusions 301, the length of the two protrusions 301 at the lower end of the integrated circuit chip assembly 300 is greater than the length of the two protrusions 301 at the upper end of the integrated circuit chip assembly 300. The length of the two protrusions 301 at the lower end of the integrated circuit chip assembly 300 enables the two protrusions 301 to only fall into the gap between the one end of the two guide rails 201 of the LGA socket 200 and the respective end wall of the LGA socket, rather than into the gap between the other end of the two guide rails 201 and the respective end wall of the LGA socket. At the same time the length of the two protrusions 301 at the upper end of the integrated circuit chip assembly 300 enables them to fall into the gap between the other end of the two guide rails 201 and the respective end wall of the LGA socket. In this way, the correct installation orientation of the integrated circuit chip assembly 300 may be ensured, avoiding damaging the spring pins in the LGA socket 200 when the installation orientation is incorrect.

In other implementations, the length of the two protrusions 301 at the lower end of the integrated circuit chip assembly 300 may be the same as the length of the two protrusions 301 at the upper end of the integrated circuit chip assembly 300. In such implementations, the operator has to ensure the correct orientation when installing the integrated circuit chip assembly 300. In some implementations, there may be two protrusions 301 only provided at one end of the integrated circuit chip assembly 300, with no protrusion at the other end. Thus, when the integrated circuit chip 300 is slid into the LGA socket 200, the two protrusions 301 are placed on the guide rails 201, and fall into the gap between the end of the guide rails 201 and the end wall of the respective LGA socket, so as to install the integrated circuit chip assembly 300 in the LGA socket 200. The positioning of the integrated circuit chip assembly 300 in the LGA socket 200 may be realized by a positioning device in an existing LGA socket 200, by for example, providing flexible protrusions on the inner walls of the LGA socket 200.

In the example shown in FIG. 3A, the integrated circuit chip assembly 300 includes an integrated circuit chip 302 and a guide plate 303 that are adhered together, and the protrusions 301 are provided on the guide plate 303. Such an example can be suitable for a standard integrated circuit chip, in which case it is just needed to first provide the guide plate 303 provided with the protrusions 301, then adhere the standard integrated circuit chip to the guide plate 303, and then slide the formed integrated circuit chip assembly 300 into the LGA socket, to install the integrated circuit chip in the LGA socket conveniently and reliably. Therefore, this is a simple, effective, and low-cost solution for preventing spring pin damage in the LGA socket.

In the example shown in FIG. 3B, the integrated circuit chip assembly 300 includes an integrated circuit chip 302 and a customizable chip lid 304, and the protrusions 301 are provided on the chip lid. In this example, it is just needed to first customize the chip lid 304 of the integrated circuit chip 302 to add the protrusions 301 thereon, and then it may be installed in the LGA socket. Therefore, this is also a simple, effective and low-cost solution for preventing spring pin damage in the LGA socket. In addition, an integrated circuit chip usually has a chip lid, which thus may be viewed as part of the integrated circuit chip. In such a case, the integrated circuit chip assembly may include just the integrated circuit chip. In addition, the protrusions 301 may not just be provided on the chip lid of the integrated circuit, but also be provided in other parts of the integrated circuit chip.

A pick and place (PnP) cap can be used in combination with the LGA socket apparatus that has been example. FIG. 4 shows a top view of an example PnP cap, a cross-sectional view at position A-A, a cross-sectional view of the LGA socket from which the PnP cap has been lifted, and a cross-sectional view at position B-B. As shown in FIG. 4, when the integrated circuit chip assembly 300 has not been installed in the LGA socket 200, the PnP cap 400 may cover on the LGA socket 200, and the PnP cap 400 has an opening 402 at the end where the integrated circuit chip assembly 300 is to be slid in (at the right end of the B-B cross-sectional view in FIG. 4).

The inner surface of the topside of the PnP cap 400 is a slope that is higher at the opening 402 end of the PnP cap than at the other end from the bottom of the LGA socket. As such, when the integrated circuit chip assembly 300 is installed in the LGA socket 200, the integrated circuit chip assembly 300 is first slid into the opening 402 of the PnP cap 400, and with further sliding inwards, automatically lifts the PnP cap 400. Therefore, the PnP cap may be removed automatically when installing the integrated circuit chip assembly, avoiding having to remove the PnP cap manually and risk damaging the spring pins of the LGA socket during such manual removal.

In the example of FIG. 4, the sidewalls of the PnP cap are higher than the sidewalls of an existing PnP cap 400, so as to facilitate the installation of the integrated circuit chip assembly 300 and accommodate the guide rails 201. In such a case, to ensure that the PnP cap 400 may still be operated by an existing automatic pick and place process in a printed circuit board assembly plant, as shown in FIG. 4, a depressed area may be provided at the center of the top surface of the PnP cap 400, and the height of the top surface of the depressed area is the same as the height of an existing PnP cap. As such, existing automatic pick and place processes may still be used, such as using a sucker machine, to place the PnP cap 400 along with the LGA socket 200 at the proper position on the printed circuit board to perform soldering.

After the LGA socket 200 has been soldered on the printed circuit board, the PnP cap 400 is no longer taken off manually, so that the PnP cap may still protect the LGA socket. Since on the bottom surface of the depressed area of the PnP cap there is a slope, when the integrated circuit chip assembly 300 is installed on the LGA socket, the PnP cap 400 can be removed automatically by the automatic removal process that has been described. In other implementations, if the PnP cap 400 and the LGA socket 200 are not to be picked and placed using an existing automatic pick and place process, or the pick and place height of an existing automatic pick and place process can be adjusted, the depressed area may be omitted.

The PnP cap 400 may also include other structures and devices the same as those of an existing PnP cap. On such example includes protrusions in the lower parts of the sidewalls of the PnP cap shown in the A-A cross-sectional view. Such protrusions are for cooperating with the notches on the sidewalls of the LGA socket 200 to lock the PnP cap 400 on the LGA socket 200.

A removal device according to techniques disclosed here can remove the integrated circuit chip assembly from the LGA socket. In some implementations, the removal device may be provided on the hold-down plate of the LGA socket apparatus. In other implementations, the removal device may be provided on the LGA socket.

Figure 5A:
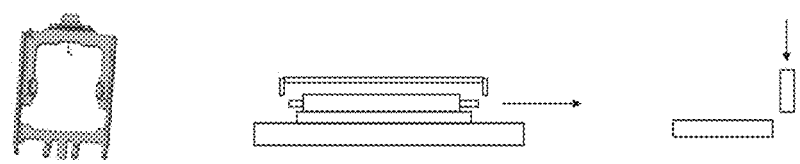
FIG. 5A is a diagram of a hold-down plate of an existing LGA socket apparatus.
Figure 5B:
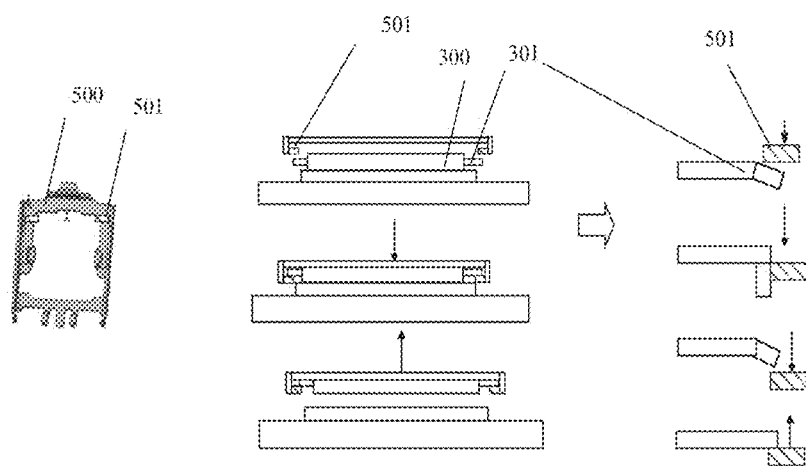
FIG. 5B is a diagram of an example hold-down plate of an LGA socket apparatus.

FIG. 5A shows a hold-down plate of an existing LGA socket apparatus, and FIG. 5B shows a hold-down plate of an example LGA socket apparatus according to techniques disclosed herein. A hold-down plate is a component in an existing LGA socket apparatus that is used to hold down the integrated circuit chip after the integrated circuit chip is installed in the LGA socket, so as to keep the contacts of the integrated circuit in connection with the terminals of the LGA socket. The hold-down plate can be pivotally connected to the LGA socket or its securing frame at one end, and the other end (the free end) may be lowered or lifted.

As shown in FIGS. 5A and 5B, compared with the existing hold-down plate, the example hold-down plate 500 according to techniques disclosed herein has two hooks 501, which are close to the inner side of the free end of the hold-down plate 500 and protrude inwardly. When the hold-down plate 500 is lowered and held down against the integrated circuit chip assembly 300, the two hooks 501 are beneath the two protrusions 301 at the end of the integrated circuit chip assembly 300 (i.e., the end close to the free end of the hold-down plate) in the at least two protrusions 301 of the integrated circuit chip assembly 300. As such, when the hold-down plate 500 is lifted, the end of the integrated circuit chip assembly 300 is lifted through the two hooks 501 and the two protrusions 301. Thus, the integrated circuit chip assembly 300 may be removed from the LGA socket 200 conveniently. The hold-down plate 500 may further includes other structures or devices, which are the same as those of the existing hold-down plate.

As shown in FIG. 5B, according to one implementation, the two protrusions 301 of the integrated circuit chip assembly 300 are made of a flexible material, and the two hooks 501 are made of a rigid material. Therefore, when the hold-down plate 500 is held down against the integrated circuit chip assembly 300, the two hooks 501 come beneath the two protrusions 301 by bending the two protrusions 301. Thus, when the free end of the hold-down plate 500 is lifted, the two hooks 501 will lift the end of the integrated circuit chip assembly 300 close to the free end of the hold-down plate 500 through the two protrusions 301.

Apart from the hooks on the hold-down plate 500, according to other examples of techniques disclosed herein, a dedicated removal device may be provided in the LGA socket 200 for removing the integrated circuit chip assembly 300 from the LGA socket 200. When the integrated circuit chip assembly 300 is installed in the LGA socket 200, at least part of the removal device is beneath at least one protrusion of the at least two protrusions 201. This part is used to remove the integrated circuit chip assembly 300 by lifting the at least one protrusion 201.

Figure 6A:
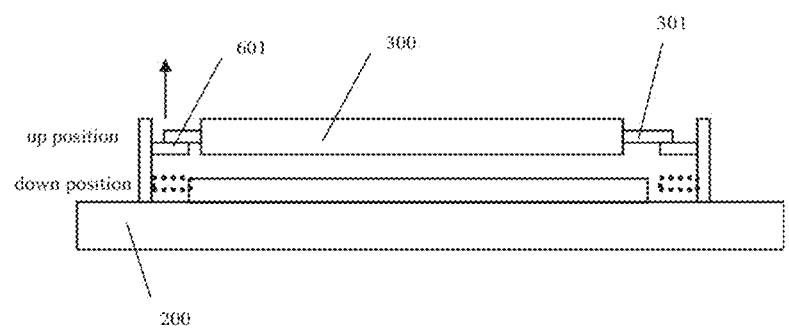
FIG. 6A is a diagram of two example pogo pins provided in an LGA socket.

FIG. 6A shows example pogo pins 601 provided in the LGA socket 200. The pogo pin 601 has two positions of up and down, and each pressing switches the pogo pin 601 between the two positions. There may be two pogo pins 601. When the integrated circuit chip assembly 300 is installed in the LGA socket 200, the two pogo pins 601 may be beneath the two protrusions 301 at either end of the integrated circuit chip assembly 300, and are at the down position due to the pressing by the two protrusions 301. When the pogo pins 601 are pressed by pressing the two protrusions 301, the pogo pins 601 will be lifted to the up position, so as to lift the end of the integrated circuit chip assembly 300.

There may also be four pogo pins 601, and when the integrated circuit chip assembly 300 is installed in the LGA socket 200, the four pogo pins 601 may be beneath the four protrusions 301 at the four corners of the integrated circuit chip assembly 300, and are at the down position due to the pressing by the four protrusions 301. When the pogo pins 601 are pressed by pressing the four protrusions 301, the pogo pins 601 will be lifted to the up position, so as to lift the ends of the integrated circuit chip assembly 300. In this way, the integrated circuit chip assembly 300 may be removed from the LGA socket 300 conveniently without the risk of damaging the spring pins of the LGA socket 200.

Figure 6B:
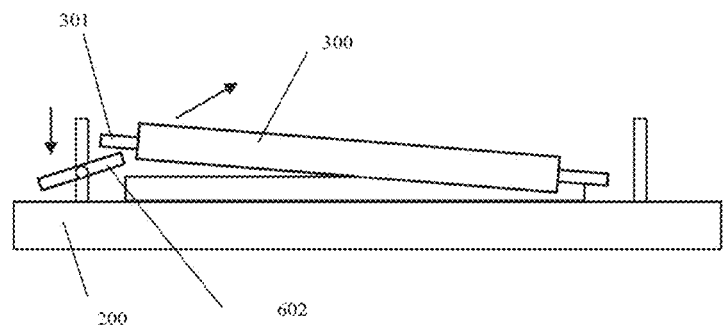
FIG. 6B is a diagram of an example lever provided in an LGA socket.

FIG. 6B shows an example lever 602 provided in the LGA socket 200. The pivot of the lever 602 may be in the sidewall of the LGA socket 200, with its one end outside the sidewall of the LGA socket 200, and the other end inside the sidewall of the LGA socket 200. The pivot may be beneath the protrusion 301 of the integrated circuit chip assembly 300 installed in the LGA socket 200. There may be two levers 602, which are beneath the two protrusions at either end of the integrated circuit chip assembly 300 respectively (e.g., the end close to the free end of the hold-down plate 500). In this way, the end of the lever 602 inside the sidewall of the LGA socket 200 may be lifted by pressing down its other end outside the sidewall of the LGA socket 200. As such, the effect is to lift the protrusion 301 and lift the one end of the integrated circuit chip assembly 300, so that the integrated circuit chip assembly 300 may be removed from the LGA socket 200 conveniently without damaging the spring pins of the LGA socket 200.

Figure 7:
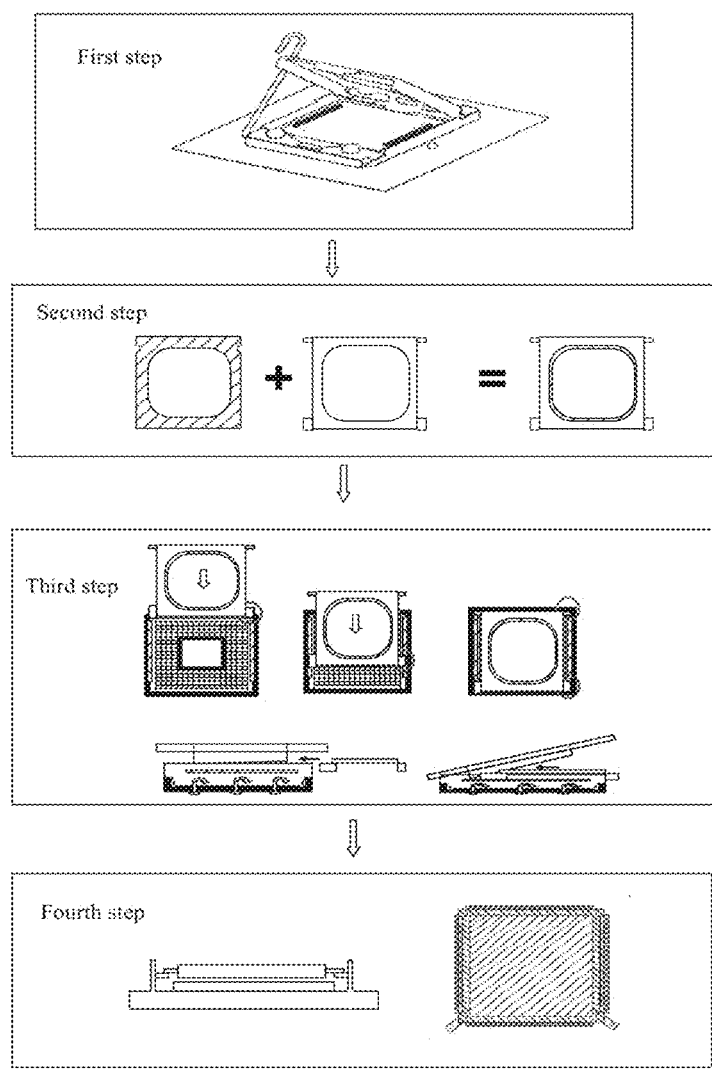
FIG. 7 is a flowchart of an example method for preventing LGA socket terminal damage.

FIG. 7 schematically shows a realization process, or method, for preventing LGA socket terminal damage. As shown in FIG. 7, the first, second and third parts of this process show the installation process, and the fourth part shows the removal process. In the first part, the LGA socket is installed in the printed circuit board, and on the inner side of the two side walls of the LGA socket are provided a guide rail respectively. The LGA socket has been covered with a PnP cap that has a protection function. In the second part, the integrated circuit chip package is assembled (e.g., adhered) to the guide plate.

In the third part, the integrated circuit chip package and the guide plate assembly is slid into the LGA socket from the side of the LGA socket through the guide rails on the LGA socket. During the sliding process, the integrated circuit chip package and the guide plate assembly automatically lift the PnP cap of the LGA socket. When the integrated circuit chip package and the guide plate assembly are completely slid into the LGA socket, the hold-down plate (not shown) may be lowered, so that the installation process is completed. In the fourth part, through the removal device provided at the two corners of the LGA socket, the integrated circuit chip package and the guide plate assembly are lifted from the LGA socket, and may then be removed manually or in another manner, thus completing the removal process.

An LGA socket apparatus for preventing LGA socket terminal damage, an integrated circuit chip assembly for preventing LGA socket terminal damage, a method for manufacturing an LGA socket apparatus, and a method for manufacturing an integrated circuit chip assembly have been described with reference to the accompanying drawings. The above description and illustrations are merely exemplary, and not restrictive of the present invention. In other embodiments of the present invention, the LGA socket apparatus and the integrated circuit chip assembly may comprise greater, fewer, or different components, and the structural relationships among the components may be different from described or illustrated. The manufacturing methods may comprise greater, fewer, or different steps, and the order of the steps may be different from that which has been described or illustrated. As such, although embodiments of the present invention are described above by referring the accompanying drawings, those skilled in the art may appreciate that the present invention is only limited by the appended claims.

The invention claimed is:

1. A land grid array (LGA) socket apparatus for preventing LGA socket terminal damage, comprising:
   an LGA socket, with two guide rails provided respectively on inner sides of two opposite side walls of the LGA socket, a height of a top surface of each guide rail from a bottom of the LGA socket being greater than a height of LGA socket terminals from a bottom of the LGA socket, and a length of each guide rail being smaller than a length of an inner side of the side wall,
   wherein the guide rails are configured to support at least two protrusions provided respectively at corners at opposite sides of an integrated circuit chip assembly when the integrated circuit chip assembly is slid into the LGA socket from a side, and
   wherein the guide rails are configured to, when the integrated circuit chip assembly is slid to an end of the guide rail, enable the at least two protrusions to fall into gaps between an end of the guide rails and an end wall of the respective LGA socket, so that the integrated circuit chip assembly is installed in the LGA socket.

2. The LGA socket apparatus of claim 1, further comprising a pick and place (PnP) cap configured to cover the LGA socket when the integrated circuit chip assembly has not been installed in the LGA socket, the PnP cap having an opening at the end into which the integrated circuit chip assembly is to be slid, and the inner surface of the top side of the PnP cap being a slope,
   wherein the slope is higher at the end of the opening of the PnP than at the other end from the bottom of the LGA socket, so that when the integrated circuit chip assembly is installed into the LGA socket, the integrated circuit chip assembly is first slid into the opening of the PnP cap, and automatically lifts the PnP cap.

3. The LGA socket apparatus of claim 1, further comprising a hold-down plate configured to, after the integrated circuit chip assembly is installed on the LGA socket apparatus, hold down the integrated circuit chip assembly so as to keep the contacts of the integrated circuit chip assembly in touch with the terminals of the LGA socket, the hold-down plate having two hooks, wherein the two hooks, when the hold-down plate is held down against the integrated circuit chip assembly, are respectively beneath the two protrusions at one end of the at least two protrusions, so that when the hold-down plate is lifted, the integrated circuit chip assembly is lifted automatically through the two hooks and the two protrusions.

4. The LGA socket apparatus of claim 3, wherein the two protrusions are made of a flexible material, and the two hooks are made of a rigid material, so that when the hold-down plate is held down against the integrated circuit chip assembly, the two hooks come beneath the two protrusions by bending the two protrusions.

5. The LGA socket apparatus of claim 1, further comprising a removal device provided in the LGA socket, when the integrated circuit chip assembly is installed in the LGA socket, the removal device being at least partially beneath the at least two protrusions, and for removing the integrated circuit chip assembly by lifting the at least two protrusions.

6. The LGA socket apparatus of claim 5, wherein the removal device is one of a lever and a pogo pin.

7. An integrated circuit chip assembly for preventing land grid array (LGA) socket terminal damage, the integrated circuit chip assembly comprising:

at least two protrusions provided respectively at corners at opposite sides of the integrated circuit chip assembly, wherein the integrated circuit chip assembly is configured to place the at least two protrusions on two guide rails provided respectively on inner sides of two opposite side walls of an LGA socket, the two guide rails to be slid into the LGA socket from a side, and wherein when being slid to ends of the guide rails, the at least two protrusions fall into gaps between ends of the guide rails and respective LGA socket end walls, so that the integrated circuit chip assembly is installed in the LGA socket.

8. The integrated circuit chip assembly of claim 7, further comprising a hold-down plate configured to, after the integrated circuit chip assembly is installed on the LGA socket apparatus, hold down the integrated circuit chip assembly so as to keep the contacts of the integrated circuit chip assembly in touch with the terminals of the LGA socket, the hold-down plate having two hooks, wherein the two hooks, when the hold-down plate is held down against the integrated circuit chip assembly, are respectively beneath the two protrusions at one end of the at least two protrusions, so that when the hold-down plate is lifted, the integrated circuit chip assembly is lifted automatically through the two hooks and the two protrusions, wherein the two protrusions are made of a flexible material, and the two hooks are made of a rigid material, so that when the hold-down plate is held down against the integrated circuit chip assembly, the two hooks come beneath the two protrusions by bending the two protrusions, and wherein the at least two protrusions are sized to be only able to fall into the gaps between one end of the guide rails and the respective LGA socket end wall.

9. The integrated circuit chip assembly of claim 7, wherein the integrated circuit chip assembly comprises an integrated circuit chip and a guide plate that are adhered together, with the protrusions provided on the guide plate.

10. The integrated circuit chip assembly of claim 7, wherein the integrated circuit chip assembly comprises an integrated circuit chip, with the protrusions provided on the integrated circuit chip.

11. The integrated circuit chip assembly of claim 7, wherein the at least two protrusions are four protrusions located at four corners of the integrated circuit chip assembly, and wherein when the integrated circuit chip assembly is slid into the LGA socket, the length of the two protrusions at the front end is different from the length of the two protrusions at the back end.

12. A method for preventing land grid array (LGA) socket terminal damage, comprising:

placing at least two protrusions provided respectively at corners at opposite sides of an integrated circuit chip assembly on two guide rails provided respectively on inner sides of two opposite side walls, the two guide rails to be slid into an LGA socket from a side, wherein when being slid to ends of the guide rails, the at least two protrusions fall into gaps between ends of the guide rails and respective LGA socket end walls, so that the integrated circuit chip assembly is installed in the LGA socket, and wherein a height of an upper surface of the guide rails from a bottom of the LGA socket is greater than a height of LGA socket terminals from a bottom of the LGA socket, and a length of the guide rails is smaller than a length of inner side of the side walls.

13. The method of claim 12, wherein the at least two protrusions are sized to be only able to fall into the gaps between one end of the guide rails and a respective LGA socket end wall.

14. The method of claim 12, wherein the integrated circuit chip assembly comprises an integrated circuit chip and a guide plate, with the protrusion provided on the guide plate.

15. The method of claim 12, wherein the integrated circuit chip assembly comprises an integrated circuit chip, with the protrusion provided on the integrated circuit chip.

16. The method of claim 12, wherein the at least two protrusions are four protrusions located at four corners of the integrated circuit chip assembly, and wherein when the integrated circuit chip assembly is slid into the LGA socket, the length of the two protrusions at the front end is different from the length of the two protrusions at the back end.

17. The method of claim 12, wherein a pick and place (PnP) cap has an opening at the end into which the integrated circuit chip assembly is to be slid, and the inner surface of the top side of the PnP cap is a slope, wherein the slope is higher at the end of the opening of the PnP cap than at the other end from the bottom of the LGA socket, and wherein when the integrated circuit chip assembly has not been installed in the LGA socket, the PnP cap covers the LGA socket, so that when the integrated circuit chip assembly is installed into the LGA socket, the integrated circuit chip assembly is first slid into the opening of the PnP cap and automatically lifts the PnP cap.

18. The method of claim 12, further comprising:

after the integrated circuit chip assembly is installed on the LGA socket apparatus, using a hold-down plate to hold down the integrated circuit chip assembly so as to keep the contacts of the integrated circuit chip assembly in touch with the terminals of the LGA socket, wherein the hold-down plate has two hooks that, when the hold-down plate is held down against the integrated circuit chip assembly, are respectively beneath the two protrusions at one end of the at least two protrusions, so that when the hold-down plate is lifted, the integrated circuit chip assembly is lifted automatically through the two hooks and the two protrusions.

19. The method of claim 18, wherein the two protrusions are made of a flexible material and the two hooks are made of a rigid material, so that when the hold-down plate is held down against the integrated circuit chip assembly, the two hooks come beneath the two protrusions by bending the two protrusions.

20. The method of claim 12, further comprising:
removing the integrated circuit chip assembly by lifting at least one protrusion of the at least two protrusions by a removal device,
wherein the removal device is in the LGA socket, and
wherein when the integrated circuit chip assembly is installed in the LGA socket, the removal device is at least partially beneath at least one protrusion of the at least two protrusions.

\* \* \* \* \*